(12) United States Patent
Tanaka et al.

(10) Patent No.: US 6,558,855 B2
(45) Date of Patent: May 6, 2003

(54) PHASE SHIFT MASK AND MANUFACTURING THE SAME

(75) Inventors: Toshihiko Tanaka, Tokyo (JP); Norio Hasegawa, Hinode (JP)

(73) Assignee: Hitachi, Ltd., Tokyo (JP)

( * ) Notice: Subject to any disclaimer, the term of this patent is extended or adjusted under 35 U.S.C. 154(b) by 111 days.

(21) Appl. No.: 09/800,501

(22) Filed: Mar. 8, 2001

(65) Prior Publication Data

US 2002/0034694 A1 Mar. 21, 2002

(30) Foreign Application Priority Data

Sep. 21, 2000 (JP) ........................................ 2000-287510

(51) Int. Cl.⁷ ................................................. G03P 9/00
(52) U.S. Cl. .......................................................... 430/5
(58) Field of Search ............................ 430/5, 325, 326, 430/330, 322

(56) References Cited

U.S. PATENT DOCUMENTS 6,124,081 A * 9/2000 Kishimura .................. 430/323
6,132,908 A * 10/2000 Shiraishi et al. ............ 430/322

FOREIGN PATENT DOCUMENTS

| JP | 5-181257 | 7/1993 |
| JP | 6-175347 | 6/1994 |

* cited by examiner

Primary Examiner—S. Rosasco
(74) Attorney, Agent, or Firm—Mattingly, Stanger & Malur, P.C.

(57) ABSTRACT

The present invention provides a method of manufacturing halftone phase shift masks in less steps to save time and cost and to increase the yield, and a halftone phase shift mask with higher phase- and size controllability. To achieve this, the halftone phase shift mask includes a structure having a shade band of resist film formed on the halftone film delineating fine patterns and around the area of fine pattern.

9 Claims, 8 Drawing Sheets

PHASE SHIFT MASK AND MANUFACTURING THE SAME

BACKGROUND OF THE INVENTION

1. Field of the Invention

The present invention relates to a photo mask, more particularly to a halftone phase shift mask suitable for manufacturing fine devices such as a semiconductor device, a semiconductor integrated circuit device, a superconductor device, a micromachine, and electronic devices, in particular suitable for forming very fine patterns, and a production method of the same.

2. Description of the Prior Art

In the manufacturing of semiconductor integrated circuit (IC) devices, a technique known as lithography is used for transferring very fine circuitry patterns onto a semiconductor wafer. The lithograph technique needs in general a projection exposure apparatus, which loads a photomask and transfers the patterns drawn on the photomask thus loaded onto a semiconductor wafer to form patterns of devices thereon. Since the exposure area of an exposure apparatus with a higher resolution is smaller in size than the area of the wafer 21 to be projected, a wafer surface plane figure will be divided into a plurality of "shots" as is shown in FIG. 2, and will be fed in stepping or scanning by one area after another to expose a plurality of chips 22 thereon. At the exposure, a scribing area 23 for separating chips each other will be provided around each chip.

In recent years, the patterns have been made finer than ever for accommodating the requirement of large-scale, high-integration of devices as well as improved device operation speed. Under such circumstances, the wavelength of the exposing light emitted from the exposure apparatus for use in the pattern formation is being shortened. As an alternative, an exposure technique known as halftone phase shifting is also used. The halftone phase shifter mask is a mask having a translucent film (referred to as a halftone film) formed on a transparent plate for attenuating the exposing light and shifting the phase. The transmissivity of the exposure light through the film is, in general, thought desirable in the range between approximately 1% and 25%. The light transmitted through this film is adjusted so as to have-certain phase difference from the light, that does not pass through the film. The best phase difference for achieving the highest resolution is at 180 degrees and the odd multiples thereof. However, the resolution will be more or less improved when the phase is approximately in 180 degrees ±90 degrees. It is known in general that the resolution may be improved by approximately 5% to 20% when using a halftone mask.

In the chip exposure, a certain part of outer frame area belonging to the adjacent shot may be overlapped to the pattern formed. When a photo mask is provided with a shade film having a sufficient shading (shielding) performance such as made of Cr or the like, the light transmitted through the outer frame area may cause probably no problem since its amount is sufficiently small. However, when using a halftone mask, the outer frame area is also a part of the halftone mask and therefore is not a perfect shield. The light transmitted through the outer frame area, which may be attenuated but not shut off, will be superposed on the pattern to be formed. The area having exposed to the superposed light will have such a problem as the thickness loss of the resist to be exposed or the decreased resolution. In accordance with the prior art technique, a shade film made of Cr was formed on the outer frame area to solve this problem. The shading film made of Cr is referred to as 'Cr shade band'

An exemplary structure of a mask having the Cr shade band is shown in FIG. 3. In the figure, FIG. 3(a) is a plan view of a mask, and FIG. 3(b) is a cross-sectional of the mask taken along with the line A-A'. A desired pattern 31 to be delineated is placed on a chip field 32 made from a halftone film (the chip field is a pattern forming area, corresponding to a circuit pattern area in manufacturing semiconductor devices). On the entire outer field surrounding the chip field 32, a Cr shade film 33 is deposited. In this figure, the reference numeral 36 designates a transparent plate.

The pattern on this chip field 32 will be delineated on the wafer by exposing it to form a chip 22 shown in FIG. 2. If the Cr shade film 33 is not deposited, the exposure will be superposed on the area 34 in the vicinity of the outer periphery of the chip field. This may happen because of foggy effect by exposure in the peripheral region. Although, in general, the exposure apparatus has a masking blade for adjusting the area size of exposure field, the precision of position alignment is as low as on the order of about 50 micrometers, and in addition, the inherent lack of sufficient sharpness of shielding characteristics of the masking blade cause the foggy effect. The multiple exposures on the outer periphery of the chip field may result in a poor resolution. On the other hand, when a Cr shade film 33 is applied to the entire surface area of the peripheral region as shown in FIG. 3, such problems may not happen as the exposure light will be shielded with a sufficient sharpness at the border.

As an alternative to the use of Cr shade band, a halftone shade band method has been proposed, in which a dense grating pattern or a checker pattern may be cut on the halftone film, the pattern being finer than the resolution of the exposure apparatus used in order to well decrease the transmissivity of the exposure light passing through the patterned area by making use of the diffraction. The method above is disclosed in the Japanese Unexamined Patent Publication No. Hei 06-175347.

References on the halftone phase shift include the Japanese Unexamined Patent Publication No. Hei 05-181257, which disclosure is incorporated herein as a reference.

Now referring to FIG. 4, the procedural steps of producing a halftone phase shift mask with a Cr shade band is shown according to a prototype experiment conducted by the inventors of the present invention. As shown in FIG. 4(a), on a quartz glass plate 40 a halftone film 41, a Cr film 42, and a resist film 43 in the order were sequentially deposited prior to exposing a desired pattern (44). It is to be noted here that the Cr film 42 was formed by the sputter technology. Then the plate was developed to form a resist pattern 43' shown in FIG. 4(b). Then, the exposed Cr film 42 and halftone film 41 were etched successively to develop Cr pattern 42' and halftone film pattern 41' as shown in FIG. 4(c). Next, after removing the resist 43' as in FIG. 4(d), resist 45 was again applied thereto as shown in FIG. 4(e) and the chip field was exposed (46). Then the development lead to the resist pattern 45' formed as shown in FIG. 4(f), while Cr film remaining on the surface unmasked by the resist was removed by etching to form the Cr pattern 42" as shown in FIG. 4(g). Finally the resist 45' was removed to obtain the halftone phase shifting mask as shown in FIG. 4(h) (which corresponds to FIG. 3(b)).

The inventors of the present invention have found that, after the experimental production cited above, there exist problems as follows. As the halftone phase shift mask using the Cr shade band has a structure in which the Cr film is deposited thereon in addition to the halftone film, (1) there are required a number of steps in manufacturing the mask, causing the high cost; (2) in addition to the considerable number of steps, the process contains such steps as sputtering and etching of the Cr film, which may often cause some defects by a particle, resulting in a lower yield of mask manufacturing; (3) in the process steps from FIGS. 4(f) to (g), the decreased phase controllability of the halftone film may be resulted by partly inhomogeneous etch during the removal of the Cr film that covers the fine-patterned halftone phase shift mask, as well as the accuracy of sizing the patterns may be decreased; (4) a material for the halftone mask should be chosen to have large selection ratio of etching compared to the Cr while at the same time the Cr film and the halftone film must be etched at a higher accuracy after compilation, therefore, the improvement of accuracy is limited by the narrow range of selectable materials. The limited range of selectable materials may cause a severe deficiency in a mask for ArF excimer laser (at the wavelength of 193 nanometers) and F2 excimer laser (at the wavelength of 157 nanometers), since both lasers emit potentially higher energy in the exposure, encountering with a problem of exposing dose tolerance of the mask.

When a halftone phase shift mask making use of a halftone shade band in lieu of the problematic Cr shade band is used, the number of steps in the manufacturing process can be decreased. However, the time required for delineating a mask will be significantly augmented due to a large number of fine patterns to be formed. Furthermore, the defect inspection of masks will also need a considerable time.

SUMMARY OF THE INVENTION

The present invention has an object to overcome the above problems and to provide an improved fine pattern mask.

A more specific object of the present invention is to provide an improved fine and precise pattern mask to allow highly accurate delineation when a plurality of multi exposures are performed with respect to an outer frame area of the very fine pattern by using a halftone phase shift-mask, as is done in the step-and-repeat process.

It is another object of the present invention to provide a method of manufacturing masks to allow the improved fine pattern masks to be produced at lesser costs with positive reproductivity.

Some typical aspects in accordance with the invention disclosed herein will be overviewed in brief below.

The phase shift mask in accordance with the present invention comprises, a phase shift film pattern constituted of a half tone film provided on a transparent plate for attenuating the incident exposure light and shifting the phase of the light, and a resist film layer provided on the outside of and surrounding a chip field on which the phase shift film pattern is formed, and partially covering the top surface of the transparent plate.

The resist film provided outwardly surrounding the chip field may function as a good shade band so as to efficiently prevent thickness loss of the resist film and degraded resolution in the area subject to receive multi exposures at the time of mask pattern delineation, thereby avoiding the problem of deposition and processing of Cr film.

When the phase shift mask incorporates a negative-type resist film in which the exposed area is left over, the manufacturing process of the mask will be further simplified.

In order not to deposit the resist film on the area in contact with for example the stage of exposure apparatus or the transporter system, the resist film will be formed only on some part of adjacent periphery approaching to the circumferences to the chip field, except for the fringed border surface of the transparent plate constituting the mask to solve the problem encountered at the time of loading into the exposure apparatus.

To achieve this, a pellicle for protecting from particle defects may be adhered on the mask plate by means of a pellicle frame, such that no resist film will be formed at the end section of the pellicle frame to be secured with the mask plate as well as at the outward circumferences of the pellicle.

It should be noted here that the present invention is drastically different from any other mask production methods. For example, the Japanese Unexamined Patent Publication No. Hei 05-289307 discloses a method for forming the mask pattern itself with the resist film, for the purpose of simplifying and improving the precision of the ordinary production process of photomasks. However the latter method uses a binary mask comprised of a transparent section for transmitting the exposure light and a sufficient shade, which mask has inherently no problem concerning the overlapping of exposure light in the outer frame.

The Japanese Unexamined Patent Publication No. Hei 09-211837 discloses an application of resist shade member to the halftone phase mask. This application is for preventing sub-peak delineation within the chip field and forming a halftone mask of rim type having halftone area only in the vicinity of the pattern edges. Here, the present invention has different objects and effects from the method cited just above, and placement of the formed resist is different therefrom. In addition, the method according to the disclosure in the Japanese Unexamined Patent Publication No. Hei 09-211837 has a disadvantage in that there is a limitation on the configuration of the rim width. The present invention is also different therefrom in that the halftone is applied not only to the rim but also to other area. The above-mentioned patent application uses, of necessity, a positive resist required from the limitation in the production process to form the shader member on the halftone film, while, on the other hand, the present invention capable of making use of a negative resist advantageously.

The Japanese Unexamined Patent Publication No. Hei 09-211837 may encounter a limitation of the film thickness of the resist on a mask because the resist is deposited on the circuit pattern area containing very fine patterns. With a thicker film, the resist may act as a wall to affect the delineation characteristics. More specifically, the fidelity to the mask size in the accuracy of size of the delineated patterns will be degraded along with the decrease of threshold resolution. This phenomenon may be prominently seen when off-axis illumination or a lens, having a larger NA (numerical aperture) is utlized.

The present invention, as have been described above, has no limitation in the thickness of the resist film since in accordance with the present invention the resist patterns are formed on the area having no pattern, in the vicinity of shots, i.e., outside of the chip field, instead of forming on the very fine and precise pattern area.

In addition, the present invention may be further characterized in that the absorbance (extinction coefficient) of the resist shade band may be suppressed to a reasonable level by making the resist film thickness larger than the thickness of the halftone film. No degradation of resolution will be occurred because, if a trace of resist is left over on the area of very fine patterns such as circuit patterns of semiconductor IC devices and the like, the residue will not alter the luminous energy of exposure light. In case in which the residue of resist may be left over at a level affecting the resolution, a fluorescence inspection that is simpler and faster than the usual inspection may readily employed to detect any defects caused by the residue. The fluorescence inspection will be described in greater details later.

The above and further objects, additional advantages and novel features of the present invention will be more fully described in following detailed description when the same is read in connection with the accompanying drawings. It is to be expressly understood, however, that the drawings are for the purpose of illustration only and not intended as a definition of the present invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

DETAILED DESCRIPTION OF THE PREFERRED EMBODIMENTS

A detailed description of some preferred embodiments embodying the present invention will now be given referring to the accompanying drawings.
[First Embodiment]

Figure 1A:
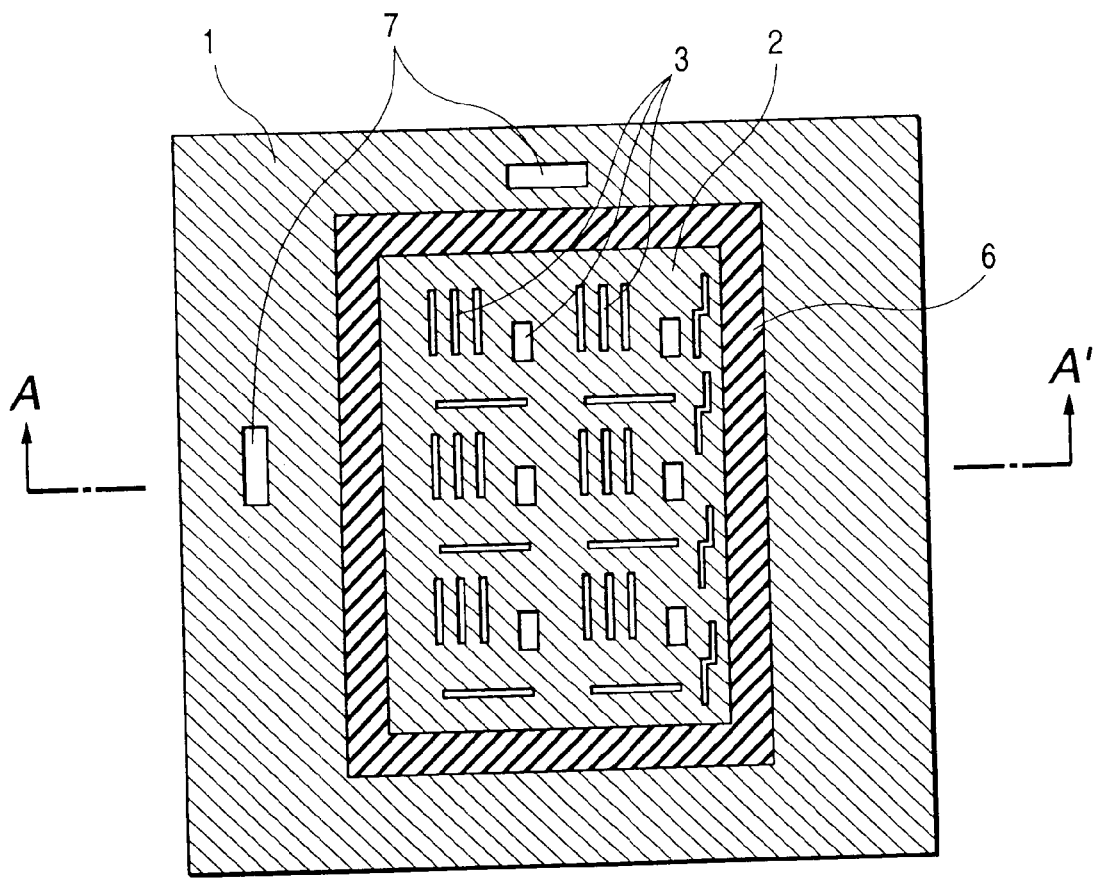
FIG. 1 is a schematic diagram of the structure of mask in accordance with the present invention, (a) in a plan view and (b) in a cross-sectional view.
Figure 1B:
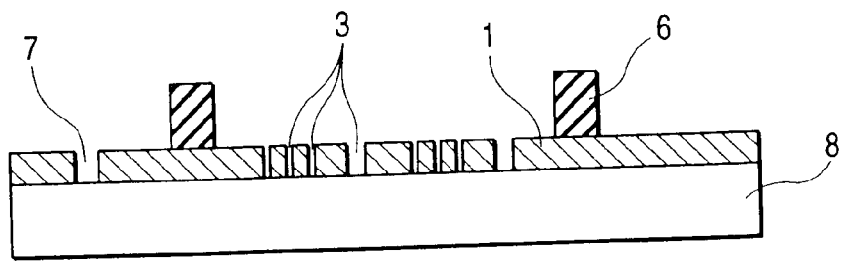
Figure 2:
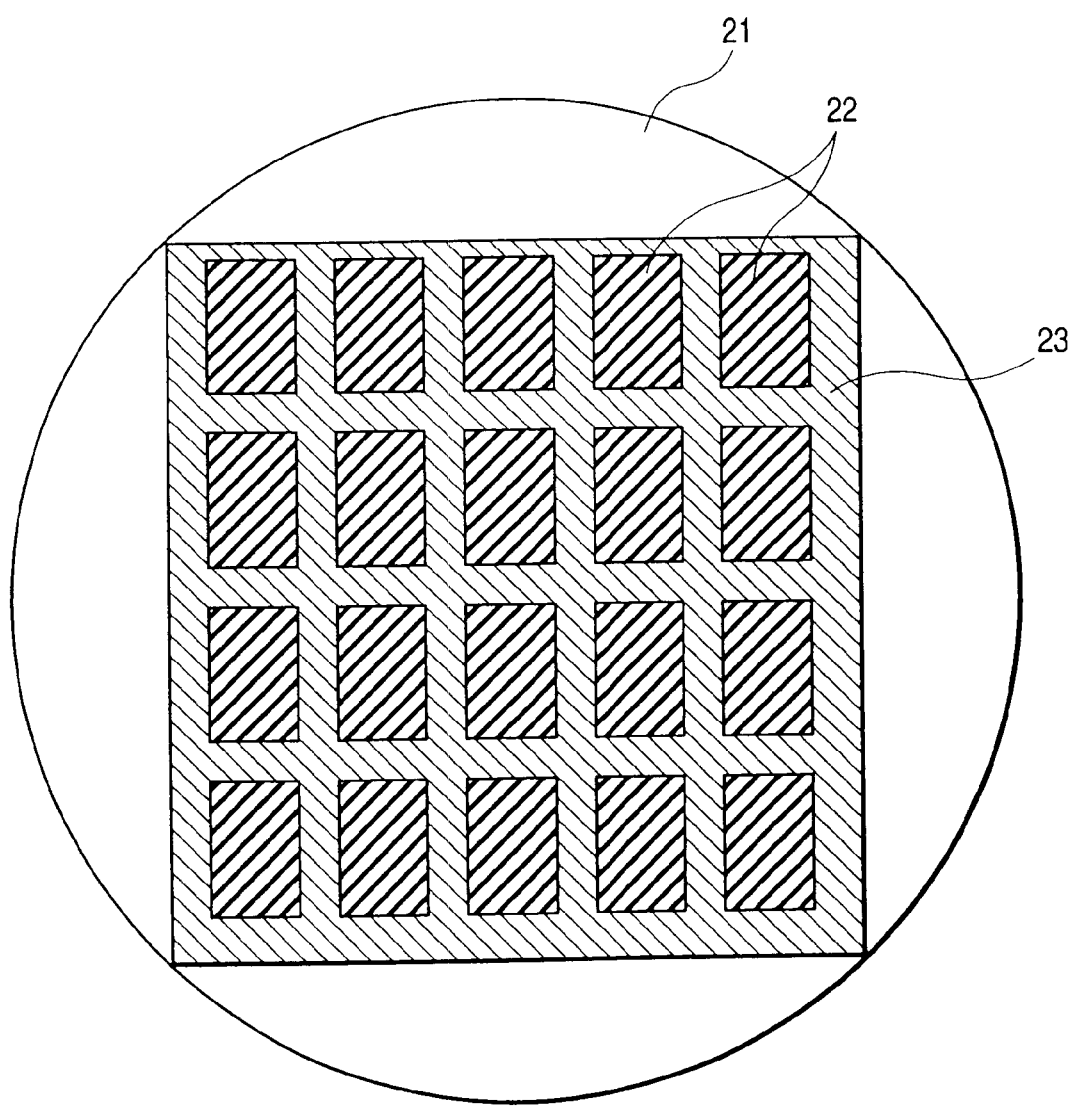
FIG. 2 is a plan view of a wafer depicting chip exposure on a wafer.
Figure 3A:
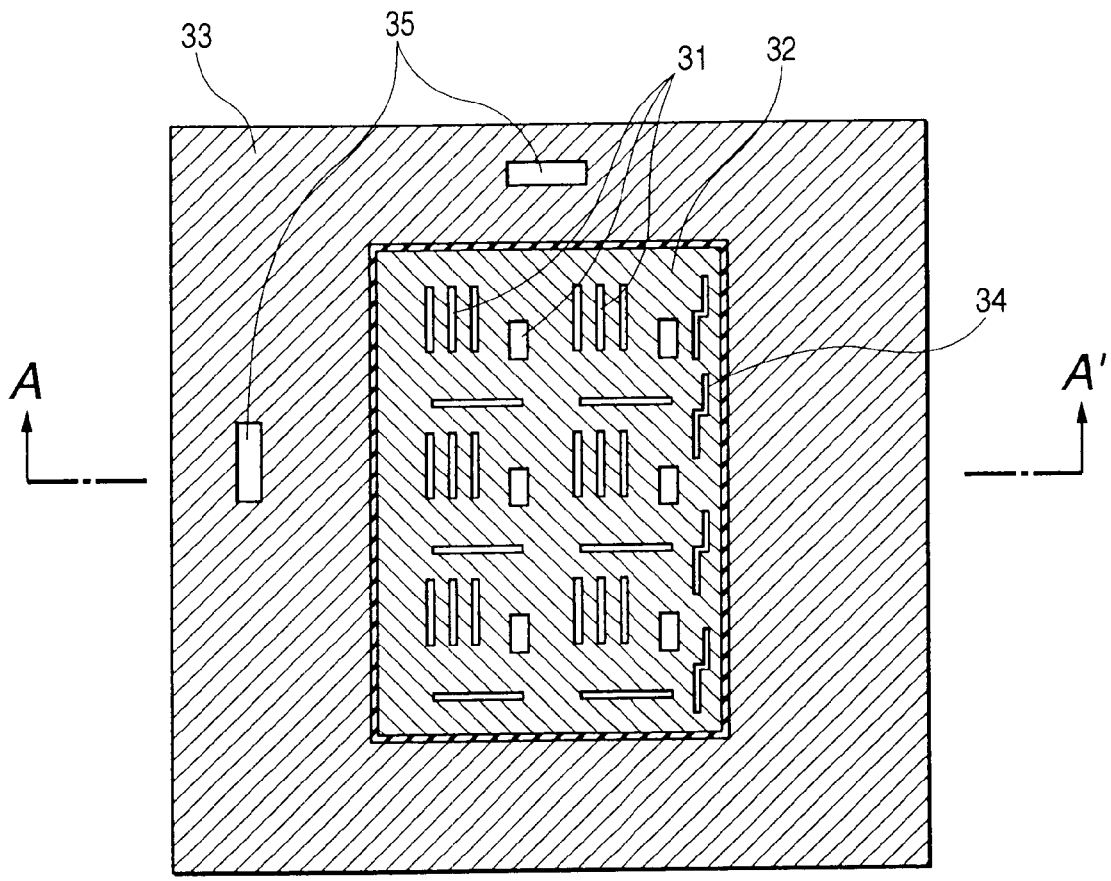
FIG. 3 is a schematic diagram of the structure of a conventional mask, (a) in a plan view and (b) in a cross-sectional view.
Figure 3B:
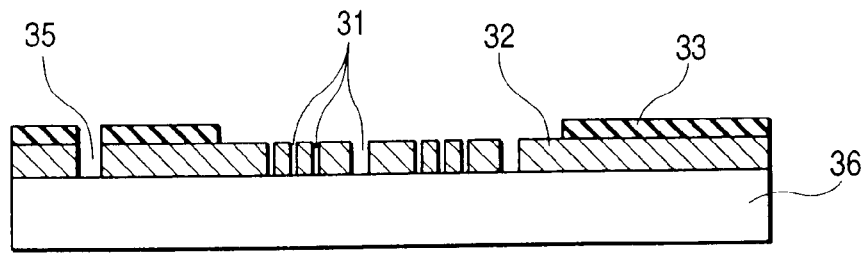
Figure 4A:
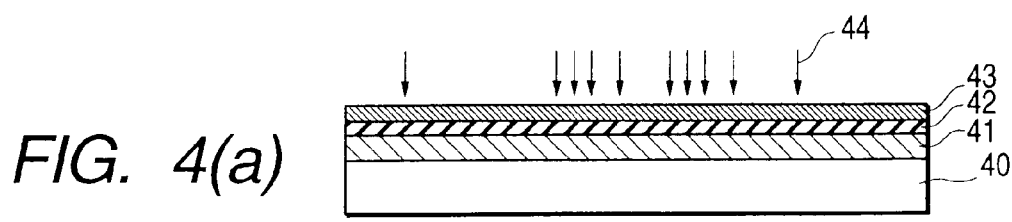
FIG. 4 is a series of cross-sectional views illustrating steps of manufacturing a conventional mask in the experiment conducted by the inventors of the present invention.
Figure 4B:
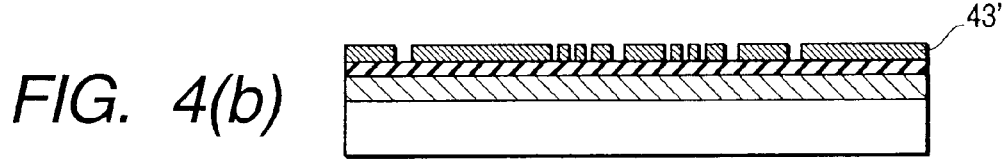
Figure 4C:
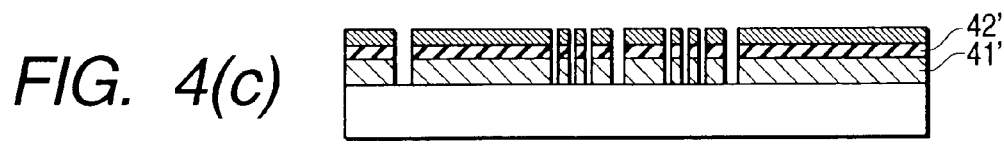
Figure 4D:
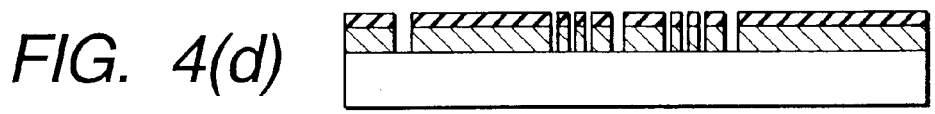
Figure 4E:
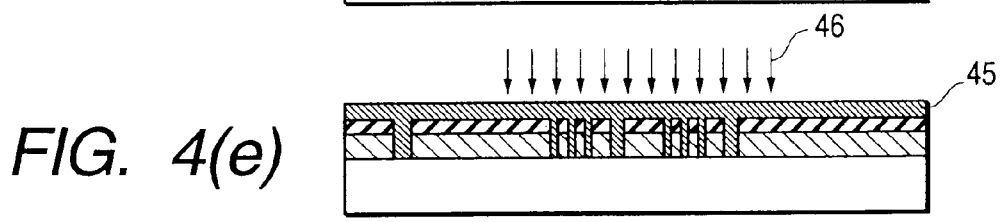
Figure 4F:
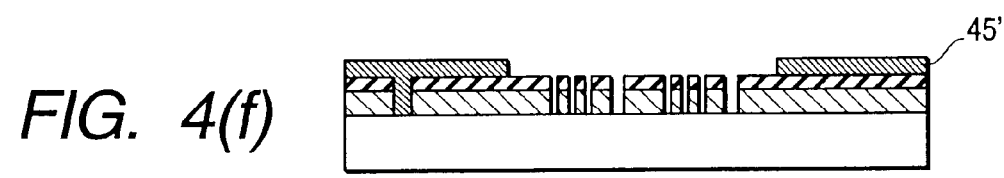
Figure 4G:
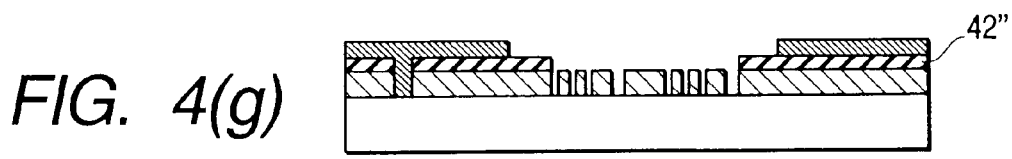
Figure 4H:
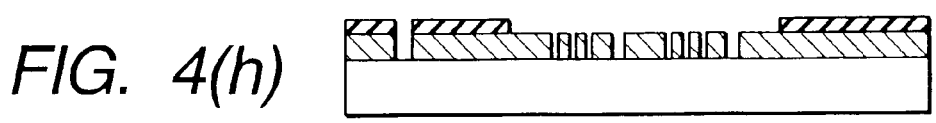

Now referring to FIG. 1, which shows a desirable structure of the halftone phase shift mask in accordance with first preferred embodiment of the present invention, the structural overview will be given below. FIG. 1(a) is a plan view of the halftone phase shift mask in accordance with the present invention. FIG. 1(b) is a cross-sectional view of the same mask as in FIG. 1(a), taken along with the line A-A'.

In the drawings reference numeral 1 designates a halftone film, reference numeral 2 a chip field, which is an area reserved for placing the IC pattern to be delineated, 3 a pattern to be delineated, 6 a shade band comprised of a resist film, 7 a reticle alignment mark, 8 a transparent plate made of quartz glass. The transparent plate may be a plate which has the transmissivity of the exposure light.

A desirable shape of the shade band 6 made of a resist film may be formed as a rectangular band (i.e., the four sided quadrilateral or tetragon) which completely surrounds the chip field 2, more preferable for ensuring the characteristics of shielding with respect to the chips in the vicinity of the periphery of a wafer. However, the shape may not be limited thereto, and may also be formed in an L-shape or C-shape, by considering the overlap of masks during the step and repeat process.

The resist film shade band 6 tends to be peeled off when run against the stage or transporter of the exposure apparatus and may cause a defect by particles. The part that may run into such members is preferably cleaned so as not to have even a trace of resist. Thus, the resist film 6 will be formed on the transparent plate 8 outside the chip field 2 only on a certain part inward of the film, rather than on the entire surface area of the top surface of the halftone film. A plurality of reticle alignment marks 7 are formed on the rest of area on the top surface. It is to be noted that a wafer mark for registering alignment between masks is also incorporated in the chip field 2 in accordance with the preferred embodiment of the present invention.

Although in FIG. 1 the surface to which the patterns will be formed is shown upwardly, by considering the mask manufacturing process, the faces will be overturned upside down when inserting the mask into the exposure apparatus such that the patterned surface goes downward. The resist film 6 will be served as a sufficiently effective shade film to prevent the thickness loss of the resist film on a wafer and the degradation of resolution in the area of multiple exposures during the delineation. The problems cited above will be solved by eliminating the difficulties in depositing and processing the Cr film.

Next, the manufacturing process of the mask will be now described in greater details below. Referring to FIG. 5, there is shown a series of cross-sectional views of a wafer in each of manufacturing steps for illustrating the manufacturing method of the halftone phase shift mask in accordance with the first embodiment of the present invention.

Figure 5A:
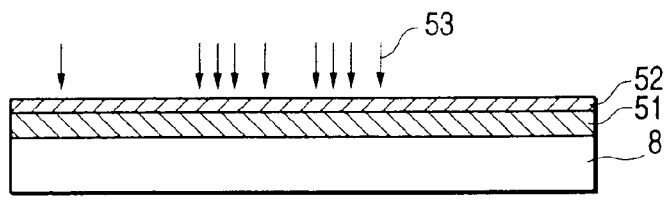
FIG. 5 is a series of cross-sectional views illustrating steps of manufacturing a novel mask in accordance with the present invention.

As shown in FIG. 5(a), a halftone film 51 was formed on a transparent plate 8 made of quartz glass, then a resist film 52 thereon to expose a desired pattern (53).

In this example a CrOxFy film was used for the halftone film 51, however, any other suitable films such as ZrSixoy film, SiON film, SiN film, CrFx film, or MoSix film may be equally used. The halftone film 51 may be formed not only by a single layer but also as a plurality of layers in order to achieve the phase shift effect. To achieve the phase shift effect, the thickness 'd' of the halftone film 51 should be set to $\lambda/(2(n-1))$, where $\lambda$ is the wavelength of the exposure light, and 'n' is the refractive index at the exposure wavelength of the halftone film 51. The best resolution and exposure latitude of the delineated pattern may be yielded at this condition but not limited thereto. The transmissivity of the exposure light was set at 6% in our experiment. The transmissivity may also be one of operational variables to carry out the present invention, which needs not to be limited thereto.

Figure 5B:
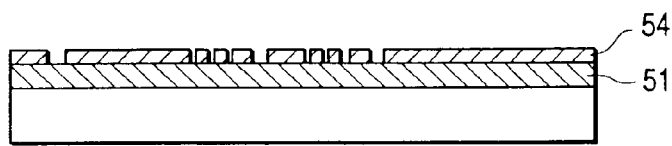
Figure 5C:

Then a resist pattern 54 was formed by developing as shown in FIG. 5(b) to selectively etch the halftone film 51 by using the resist pattern 54 as the mask.

Figure 5D:
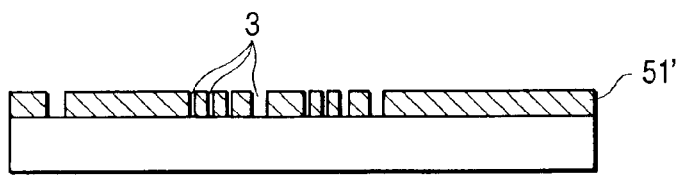
Figure 5E:
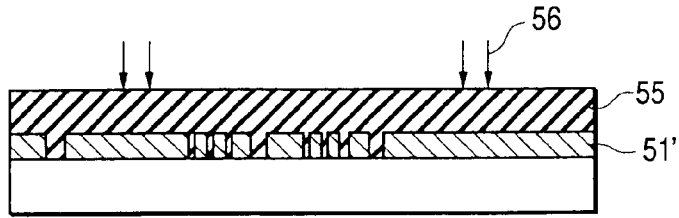
Figure 5F:
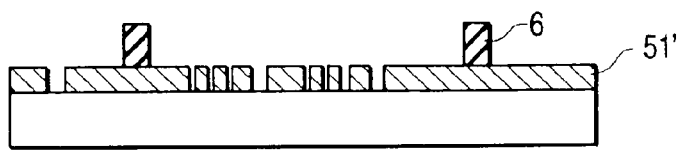

Thereafter, the resist 54 was peeled off and removed as shown in FIG. 5(d) to form a halftone film 51' having a desired pattern 3 defined.

Next, a negative-type resist film 55 was applied on the top surface of the transparent plate 8 as shown in FIG. 5(*e*) and exposure (56) of the region outside the chip field was performed. The part of resist film that would contact with the stage or the transporter of the exposure apparatus, however, was not exposed at this exposure. Basically it will be sufficient to perform an exposure so as to form a resist band 6 with a width sufficiently covered from the circumferential border of the chip field by the masking blade equipped in the exposure apparatus. The exposure was carried out in our experiment by means of electron beams in this embodiment, but other lights including lasers may be equivalently used instead.

The thickness of the negative-type resist film 55 and film 6 was approximately 3 micrometers in this example, however this is merely an example. It was found that the thickness of the negative-type resist film 55 was more effective when made thicker than the halftone film 51. The upper limit of the thickness including the halftone film 51 may be preferably a thickness at which the transmissivity with respect to the exposure light, becomes less than or equal to approximately 0.3%. The transmissivity of the film with respect to the exposure light, including the halftone film 51 may also be preferably less than or equal to 1% in case the number of multiple exposures on the same place is up to 4.

The optical absorbance of the exposure light by the negative-type resist film 55 and shade band 6 was found to be effective in less than or equal to 0.1 when expressed by the extinction coefficient. If the absorbance is excessively large, the resist remaining on the mask will act as a shade to potentially cause a particle defect. The amount of residual resist in an extent of scum may not cause a defect of delineation. It was concluded that better extinction coefficient might be less than or equal to 0.1, based on an extensive investigation on the range of feasible inspection of a defect particle in an extent of the thickness that may cause a defect of delineation.

After developing the mask as shown in FIG. 5(*f*), the resist pattern 6 was formed on the halftone film 51'. No special treatment was necessary for effectively removing the negative-type resist film 55 outside the pattern exposure area since the negative-type resist was used for the shade on the halftone film 51'. The residual resist outside the pattern exposure area would be peeled off from the mask when the mask was attached into the exposure apparatus and would produce particles that cause the defect of delineation. The use of the negative-type resist has an advantage of reducing the surface area of delineation and improving the throughput. Here the term "negative-type resist" defines a type of resist, which may leave the resist in the area illuminated thereon after development.

Thereafter a thermal process was applied in order to increase the shielding rate of the resist shade band 6 and to improve the exposure light illumination tolerance. The inventors found another effect that the thermal process did not cause a deformation by using the negative-type resist that produces a crosslinking reaction. In our experiment a thermal process at 220 degrees Cercius was conducted, however, a thermal process at much higher temperature, such as at 260 degrees might be applicable. The required shape for a shade band was maintained even after such a thermal process at high temperature, without any thermal breakdown. It may be possible to further improve the illumination and thermal tolerance by applying a thermal process at a high temperature while a far UV light is being emitted to the mask. The far UV illumination as well as the thermal process will reduce the gases and organics released from the resist at the time of exposure of the mask so that the problem of blur in the lenses of exposure apparatus and in the pellicle adhered to the mask may be effectively solved.

The resist pattern may be formed partially on the halftone film within the chip field in order to prevent the sub-peak delineation for the mask used in the present embodiment in accordance with the present invention (not shown in the drawings for the purpose of simplicity).

In accordance with the method of the present invention described above, the number of steps in the mask manufacturing process was decreased to 6 steps from 8 steps required in case of FIG. 4. The time required for manufacturing was also reduced to approximately two thirds. Furthermore, the defects by particles were considerably decreased to achieve a higher yield of mask manufacturing. The phase controllability was improved from 4% to 3%, while at the same time the sizing accuracy was improved by 5%.

Figure 7:
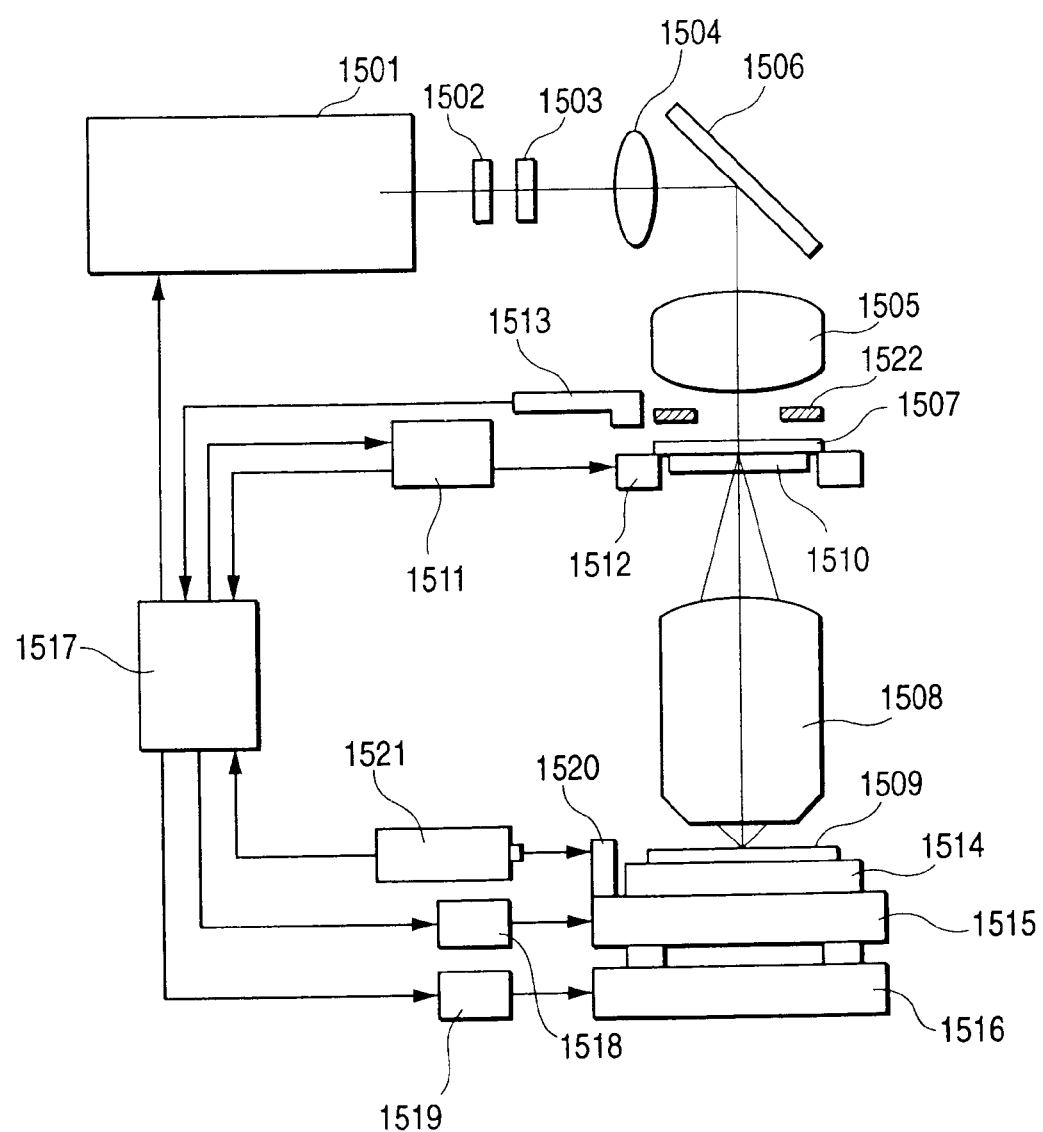
FIG. 7 is a schematic diagram of an exposure apparatus used in accordance with the present invention.

Now referring to FIG. 7, there is shown a typical example of a reduced projection type exposure apparatus for delineating a mask pattern onto the primary surface of a semiconductor wafer by means of the phase shift mask in accordance with this embodiment of the present invention. The exposure light emitted from the light source 1501 of the reduced projection type exposure apparatus will pass through a fly eye lens 1502, an illumination pattern adjusting aperture 1503, a condenser lens 1504 and 1505, and a mirror 1506 to illuminate a mask 1507. A masking blade 1522 will be placed on the mask 1507 so as to adjust the aperture radius in correspondence with the size of the illumination area to be exposed. The mask 1507 will be mounted its principal plane (first principal plane) having a shade pattern directed downwardly (opposing to the semiconductor wafer 1509). Then in this arrangement the exposure light will be emitted from the back side of the mask 1507 (second principal plane). The mask pattern defined on the mask 1507 will thereby be projected on the semiconductor wafer 1509, which is a sample plate, through the projector lens 1508. On the first principal plane of the mask 1507, a pellicle 1510 is attached when required, in order to prevent failed pattern delineation failure caused by the residual particles. The mask 1507 will be attached on a mask stage 1512 controlled by a mask position controller means 1511 by means of vacuum sucking, and an alignment detector means 1513 will register the alignment of the mask, so that the center of the mask will be precisely aligned to the optical axis of the projector lens. The semiconductor wafer 1509 will be mounted on a wafer stage 1514 by vacuum sucking. The wafer stage 1514 will be mounted on a Z-stage 1515 displaceable in the direction of Z-axis, i.e., the direction of optical axis of the projector lens 1508. The wafer stage mounted on the Z-stage will be mounted on an X-Y-stage 1516. The Z-stage 1515 and the X-Y-stage 1516 will be driven by their respective driver means 1518 and 1519 in response to the control commands supplied from a primary control system 1517, and will be capable of moving on an exposure position desired. The exposure position will be precisely monitored by a laser measuring system 1521 by means of the position of a mirror 1520 fixed on the Z-stage 1515. The alignment detector means 1513 may be implemented by using for example a halogen lump.

The resist on the mask was carefully removed by the exposure to prevent a resist film from remaining on the part in contact with the stage or the transporter system of the exposure apparatus, in order to avoid the occurrence of particles caused by the transportation. Without this clean-up step, particles were produced and caused the delineation defects.

The mask in accordance with the present invention was mounted on this exposure apparatus for performing a step and scan exposure by means of ArF excimer laser at the wavelength of 193 nanometers to delineate a mask pattern onto a wafer. As the result any defect of delineation was developed, and the alignment accuracy was improved approximately 2% in comparison to the conventional process.

Although in this embodiment the ArF excimer laser was used, KrF excimer laser (at the wavelength of 248 nanometers) was also good for achieving an almost similar effect. When the wavelength is longer than 200 nanometers the absorbance of the resist film may decrease and the shielding rate may decrease. However, in accordance with the present invention the similar effect was attained in case of the far UV illumination with no problem. This is because (1) the mask is formed on the halftone film that does not have inherently a high transmissivity, (2) the absorbance is increased by the thermal process of the resist, (3) the thickness of a resist shade bond may be increased to a sufficient level if required, since a higher accuracy of the size of film is not required therefore. The similar effect was also obtained by using the UV light if the thickness of the resist pattern 6 is made much thicker to for example approximately 10 micrometers.

The resist shade band 6 is formed on a halftone film 1, through which the exposure light passes and penetrates into the resist shade band 6. Moreover, the resist film 6 will be illuminated by the light dimmed or attenuated by the halftone film 1, therefore the light stability or tolerance of the resist shade band 6 will not be a problem.

In the above first embodiment, a negative-type resist containing novolac resin as the base polymer was used. However, a resist containing phenol resin as the base polymer may be equivalently used. Furthermore, even a black matrix containing carbons may be used in accordance with the present invention. The black matrix has a favorite advantage of the strength of the light stability.

[Second Embodiment]

In this embodiment, an exemplary implementation will be described in greater details, in which a transparent thin-film pellicle is placed on the principal plane of a mask for achieving the effect of preventing any particles from adhering on the pattern forming surface (first principal plane) of the mask. Other details are similar to the preceding embodiment thereby the description thereof will be omitted.

Figure 6A:
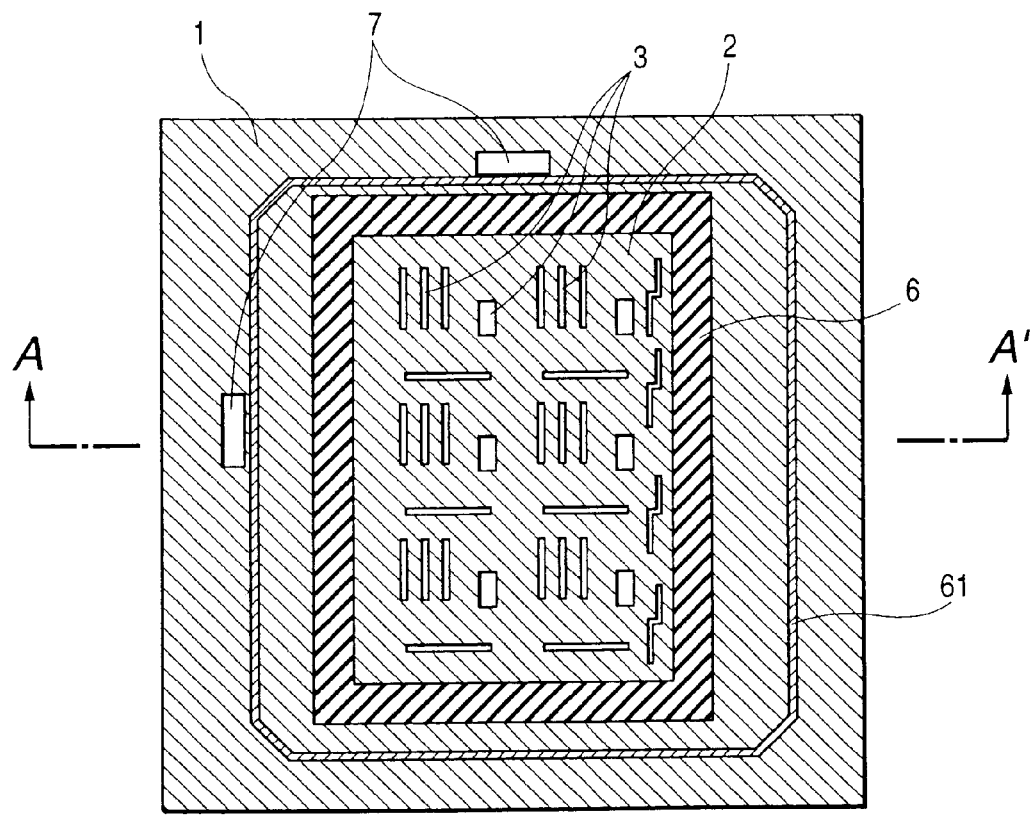
FIG. 6 is a schematic diagram of the structure of mask in accordance with second preferred embodiment of the present invention, (a) in a plan view and (b) in a cross-sectional view when the mask is loaded into an exposure apparatus.

A specific example of the mask in accordance with this preferred embodiment is shown in FIG. 6. In FIG. 6, (a) is a plan view of the mask, (b) is a cross-sectional view taken along with the line A-A', when the mask is mounted on an appropriate apparatus.

In this embodiment, a pellicle 62 is secured and fixed on the principal plane (first principal plane) of the mask, by means of a pellicle attachment frame 61. The pellicle 62 is placed on a pellicle cover area, in which area the mask is covered by a pellicle. More specifically the pellicle 62 is placed so as to include the entire chip field 2 of the mask and the resist film shade band 6, by overlapping over the halftone film 1 in the pellicle coverage region outside the IC pattern area.

Figure 6B:
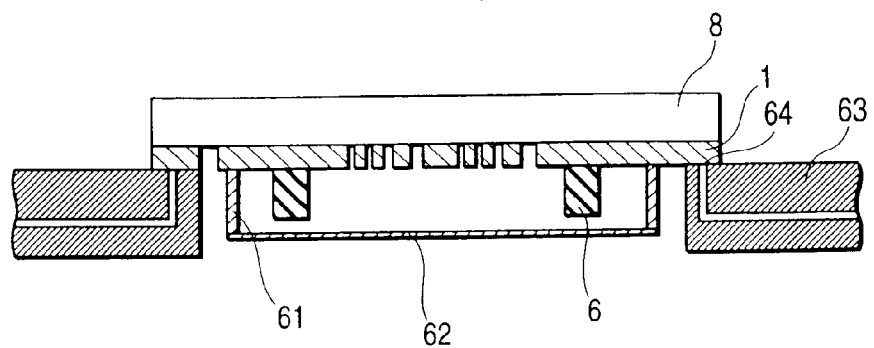

In this embodiment, the base of the pellicle attachment frame 61 is fixed to directly mate with the halftone film 1 of the peripheral inner area of the mask. The peripheral inner area here designates a part of area within the optical pattern but apart sufficiently from the resist film 6. The pellicle attachment frame 61 may thereby be held so as not to peel off. The resist film 6, if formed on the attachment area of the pellicle attachment frame 61, may peel off when attaching and removing of the pellicle attachment frame 61 are performed, thereby causing the development of particles. In this embodiment, the development of particles may be prevented by securing the pellicle attachment frame 61 to the halftone film 1 in direct contact. This effect may also be achieved by fixing the pellicle attachment frame 61 in direct contact with the transparent mask plate 8. The resist film is not formed on the surface area 64 where the mask will contact with the mounting member 63 of the exposure apparatus as shown in FIG. 6(b), in order to prevent the development of particles caused by the peeling off or scratch of the resist film 6.

In accordance with the second preferred embodiment of the present invention, following effects may be obtained in addition to those obtained by the preceding first preferred embodiment:

(1) The pellicle provided on the mask may prevent particles from adhering on the mask, and may suppress or prevent the degradation of the delineating pattern due to the adhered particles.

(2) The pellicle attachment frame secured to the shade pattern or mask plate in direct contact may prevent the resist film for forming the shade pattern from peeling off or wearing at the time of attaching or removing the pellicle. The development of particles caused by the peeled or scratched resist film can be avoided.

[Third Embodiment]

In third preferred embodiment of the present invention a simple and convenient method of inspection of defects caused by resist residuals on the formed mask surface will be described.

Ar laser beams were irradiated to the chip field on which IC patterns were placed, through a photo mask used in the preceding first and second embodiments. Then the fluorescence produced from the benzene rings, a primary component of the resist, was observed. When the sensitivity of a photomultiplier is tuned to the wavelength of the fluorescent light, the residual resist can be detected at an extremely high sensitivity, since in theory resist has not to exist in the chip field. In practice, a residual resist of thickness of 15 nanometers could be detected even through the pellicle.

The film thickness mentioned above may transmit almost all of the exposure light, thus may not cause a delineation defect. It is possible to inspect defects by irradiating Ar laser beams to the entire chip field at once, and in our experimentation, the inspection of defects caused by the residual resist could be performed within a very short period of time at a reasonably sufficient sensitivity. The inspection in accordance with this embodiment may be completed only in ten minutes, while in comparison the conventional defect inspector takes approximately two hours. The correction of photomasks in accordance with the inspection results will be practically possible, resulting in that a higher yield of production will be expected.

In accordance with the third preferred embodiment of the present invention, the inspection of photomasks may be performed in a very simple manner by means of a photomask inspection apparatus, which comprises a means for generating laser beams, a means for mounting to an inspection bench a photomask having the resist deposited thereon, a means for irradiating the laser beams to the photo mask thus mounted, and a means for detecting fluorescence developed from photomask residual materials by irradiating laser beams. The present invention may provide a practical method of manufacturing masks having very fine mask patterns delineated thereon in great volume and at a reduced cost.

[Fourth Embodiment]

In fourth preferred embodiment of the present invention a mask plate is used which is formed on a glass substrate having the transmissivity with respect to the exposure light, with an outer frame made of a metal. The term "metal" with respect to the mask shade material refers to chromium, chrome oxides, and compounds of other metals, and in general includes simple or pure substances, compounds, and complexes containing metallic elements, those substances exhibiting the shading effect. The metallic compounds containing silicone and nitrogen are also included as well. Polysilicon may be included under the condition that the mask alignment mark detecting light has the wavelength shorter than 550 nanometers.

Some exposure apparatuses use lighting by halogen lamps, red LEDs, or HeNe laser, for detecting the mask alignment mark. The halftone film adjusted to tune to short wavelength lights may not have sufficient shading characteristics with the lights of long wavelengths, resulting in a problem that the mask alignment mark cannot be detected. In order to solve this problem an outer frame made of a metal for the mask alignment is formed previously.

Figure 8A:
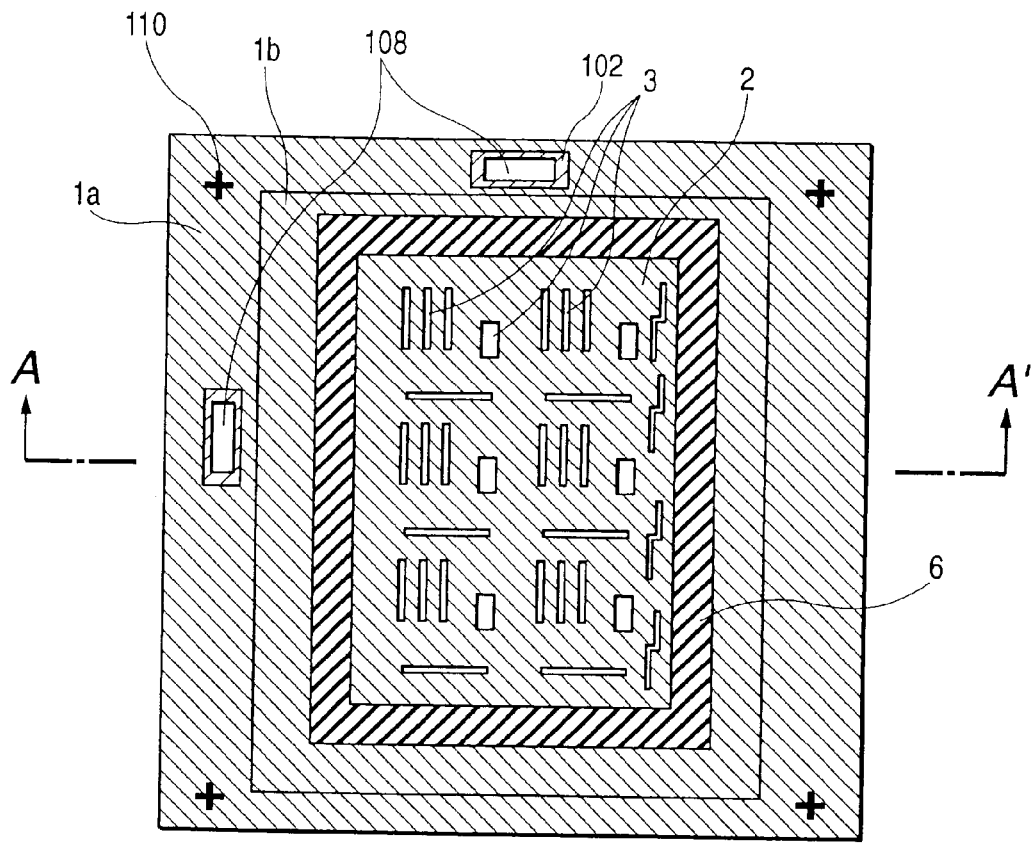
FIG. 8 is a schematic diagram of the structure of a mask in accordance with third preferred embodiment of the present invention, (a) in a plan view and (b) in a cross-sectional view.
Figure 8B:
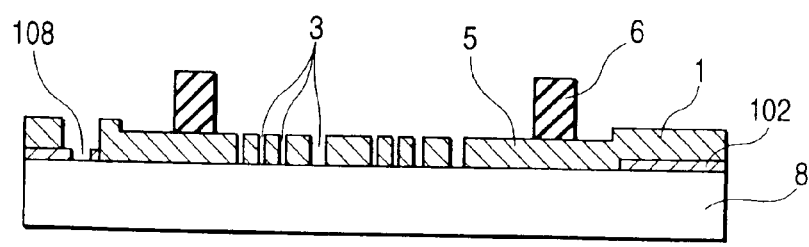

Now referring to FIG. 8, there is shown a mask structure therefor. FIG. 8(a) is a plan view of a mask in accordance with the present invention, viewed from above. FIG. 8(b) is a cross-section of the mask taken along with the line A-A' shown in FIG. 8(a). In the figures, the reference numeral 102 designates the metal layer, 108 the mask alignment mark, 110 a mark for alignment of electron beam delineation. The reference numeral 1a designates a region for forming the metal layer, 1b a region without metal layer. In the region for forming metal layer 1a, the mask alignment mark 108 and the electron beam delineation alignment mark 110 are disposed. In the region 1b inside the metal layer the chip field 2 is disposed. The resist shade band 6 may be formed within the region 1b, however part of the resist pattern may be extended into the metal layer forming region 1a.

The steps of mask manufacturing process in accordance with the present embodiment will be now described below. An outer frame 102 of metal layer will be formed on the glass plate 8. The mask alignment mark 108 and the electron beam delineation alignment mark 110 will have been formed on the outer frame 102. Then the halftone film 1 having desired patterns designed for the delineation will be formed through the process similar to that of the first preferred embodiment described above. At this point, the pattern will be formed by the electron beam delineation in reference to the position of the electron beam delineation alignment mark 110. The pattern may be formed at a high precision by continuously monitoring the position of mark to delineate the pattern in order to prevent the deviation. The halftone film on the electron beam delineation alignment mark 110 will preferably be removed. At this point the openings on the mask alignment mark should be made greater than the mark defined on the metal layer, taking into consideration the deviation from the metal layer pattern. Thereafter the resist pattern 6 will be formed on the halftone film 1 and 5 by the process similar to that shown in the preceding first embodiment.

In accordance with the method disclosed herein, the electron beam delineation alignment mark 110 may be formed with an outer frame metal layer 102 having sufficient shade characteristics with respect to the long wavelength light, allowing to eliminate the problem of mask alignment with the long wavelength as have been described above. The method in accordance with the present invention further improves the process accuracy and phase controllability of the halftone film, when compared with the conventional methods. In the method disclosed in the present invention the deposition and processing of metal layer are required, the cost of mask manufacturing will be higher than the preceding first preferred embodiment. The total cost of manufacturing mask sets can be lowered by iterative use of the metal layer, including the regeneration of halftone film, however.

More specifically, a larger outer frame surrounding the chip field may be formed so as to be reused in a versatile manner. The fine tailoring to a specific chip field of products may be carried out by adjusting the size of the resist shade band 6. The reuse of materials in accordance with the present method is effective in the light of saving and recycling of resources.

As can be appreciated from the foregoing description, the present invention may be used to a mask used for delineating very fine patterns. Therefore, the present invention may be effectively and equivalently applied to photomasks used for manufacturing superconductor devices, micromachines, electronic devices, as well as semiconductor apparatuses and semiconductor integrated circuit devices, and in particular to halftone phase shift masks suitable for delineating very fine patterns.

In brief, the advantages obtained by embodying the present invention may include following aspects.

(1) The mask in accordance with the present invention will be manufactured in less number of steps of manufacturing process, in less time needed for manufacturing, and in less costs.

(2) The mask in accordance with the present invention will be produced with a higher yield of mask manufacturing process since the sputtering and etching of Cr film that may often cause defects by particles may be eliminated in addition to the less number of steps in the manufacturing process.

(3) A process, as is performed in the conventional processes, for removing the shade material such as Cr on the halftone film by etching, will be eliminated. The halftone film will thereby not be affected by partly inhomogeneous etch which causes different thickness of the halftone film from a part to another. Therefore, the phase control ability of the halftone film as well as the accuracy of pattern will be highly improved.

(4) Consideration will not be necessary on the selection ratio of etching with Cr, at the time of selecting the materials for the halftone film, allowing a wider range of materials to be used for the halftone film material.

(5) In accordance with the mask of the present invention, defects caused by the resist residuals will be detected in less time at higher sensitivity than ever by using a fluorescence inspection method.

It is further understood by those skilled in the art that the foregoing description is preferred embodiments of the disclosed invention and that various changes and modifications may be made in the invention without departing from the spirit and scope thereof.

What is claimed is:

1. A phase shift mask, comprising:

a transparent plate, a phase shifter pattern provided on said transparent plate for attenuating exposure light and for shifting the phase of the exposure light; and a resist film for partially covering a top surface of said transparent plate around the outer circumferences of said phase shifter pattern.

2. A phase shift mask according to claim 1, wherein:
said resist film is a negative type.

3. A phase shift mask according to claim 1, wherein:
said phase shifter shifts the phase of said exposure light in odd multipliers of 180 degrees.

4. A phase shift mask according to claim 1, wherein:
said resist film will be thermal processed after exposing and developing.

5. A phase shift mask according to claim 1, wherein:
said resist film is provided on said phase shifter except for the surface area of surrounding circumferences of said transparent plate.

6. A phase shift mask according to claim 1, wherein:
said phase shifter pattern and said resist film surrounding the pattern are covered by a pellicle.

7. A phase shift mask according to claim 1, wherein:
said resist film is thicker than said phase shifter.

8. A phase shift mask according to claim 1, wherein:
the extinction coefficient of said resist film with respect to said exposure light is less than or equal to 0.1.

9. A halftone phase shift mask, comprising:

a transparent plate;

a halftone phase shift film provided on said transparent plate for forming a circuit pattern area;

a resist film provided on said phase shift film so as to enclose the outer circumferences of said circuit pattern area.

* * * * *